US010476483B2

United States Patent
Straeussnigg et al.

(10) Patent No.: US 10,476,483 B2
(45) Date of Patent: Nov. 12, 2019

(54) DECIMATION FILTER

(71) Applicant: Infineon Technologies AG, Neubiberg (DE)

(72) Inventors: Dietmar Straeussnigg, Villach (AT); Peter Bogner, Wernberg (AT); Michael Kropfitsch, Koettmannsdorf (AT); Jens Barrenscheen, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/808,157

(22) Filed: Nov. 9, 2017

(65) Prior Publication Data

US 2019/0140625 A1 May 9, 2019

(51) Int. Cl.
*H03H 17/06* (2006.01)
*H03H 17/02* (2006.01)

(52) U.S. Cl.
CPC .... *H03H 17/0664* (2013.01); *H03H 17/0276* (2013.01); *H03H 17/0671* (2013.01); *H03H 17/0685* (2013.01); *H03H 17/0286* (2013.01)

(58) Field of Classification Search
CPC ............ H03H 17/045; H03H 17/0664; H03H 17/0671; H03H 2017/0678
USPC ........................................................ 708/313
See application file for complete search history.

(56) References Cited

U.S. PATENT DOCUMENTS

| | | | | |
|---|---|---|---|---|
| 6,298,361 | B1 * | 10/2001 | Suzuki | H03H 17/0266 708/300 |
| 7,526,254 | B2 * | 4/2009 | Toporski | H04B 1/006 455/306 |
| 8,358,229 | B2 * | 1/2013 | Barrenscheen | H03M 3/496 341/143 |

OTHER PUBLICATIONS

D. O'Sullivan et al., Isolated Motor Control Feedback Using the ADSP-CM402F/ADSP-CM402F/ADSP-CM407F/ADSP-CM408F SINC Filters and the AD7401A, Analog Devices AN-1265 Application Note, 2015 (Year: 2015).*
R. Kiely, Understanding and Eliminating 1/f Noise, Analog Devices Analog Dialogue 51-05, May 2017 (Year: 2017).*
M. Hartshorne, Using the AMC1210 in Resolver Motor Control Systems, Texas Instruments Application Report SBAA144, 2006 (Year: 2006).*
Analog Devices, Data Sheet AD7177-2, 32-bit, 10kSPS, Sigma-Delta ADC with 100us Settling and Tru Rail-to-Rail Buffers, Rev.B., www.analog.com, 2016. (Year: 2016).*

* cited by examiner

*Primary Examiner* — Andrew Caldwell
*Assistant Examiner* — Emily E Larocque
(74) *Attorney, Agent, or Firm* — Slater Matsil, LLP

(57) ABSTRACT

Filters are discussed where a first window function and a second window function are applied to a digital input signal, wherein a window length of the first window function is longer than a window length of the second window function. The results of this windowing are integrated.

19 Claims, 11 Drawing Sheets

DECIMATION FILTER

TECHNICAL FIELD

The present application relates to decimation filters and corresponding methods.

BACKGROUND

In many application like digital control loops or sensor applications with digital outputs, sigma-delta analog-to-digital converters (ADCs) having a high sampling rate, e.g. using oversampling, to obtain a high resolution are used. In case the analog-to-digital converter is used for a digital control loop, a group delay of a signal measured and digitized by the analog-to-digital converter may be required to be small. In sensor applications, it is desirable to obtain a measurement value with high precision within a short time and then deactivate the sensor again to reduce losses. In both examples, it is desirable to convert the sigma delta signal having a high sampling rate to a digital signal having a reduced sampling rate and a high resolution quickly. Such a conversion from a high sampling rate to a lower sampling rate is referred to as decimation. A high speed of decimation to obtain a reliable signal may be desirable, in particular in some applications for error detection like short circuit detection.

Conventionally used decimation filters include comb filters. Such conventional filters may have a relatively high group delay.

Another approach for decimation is a combination of an integrator with a so-called "windowing", where a block of digital samples is weighted by a window function and then integrated. In this approach, a high window length, corresponding to an integration over many digital samples, increases accuracy, but also increases a time needed to provide a decimated signal and therefore reduces the speed of decimation.

SUMMARY

According to an embodiment, a device includes: a windowing circuit configured to apply a first window function to a first digital signal to generate a second digital signal and to apply a second window function to the first digital signal to generate a third digital signal. A window length of the first window function is longer than a second window length of the second window function.

The device further includes a first integrator configured to receive the second digital signal, and a second integrator configured to receive the third digital signal.

According to another embodiment, a device includes: a first decimation path configured to provide a first decimated signal based on an input signal, and a second decimation path configured to provide a second decimated signal based on the input signal, wherein the second decimation path has a faster response to a change in the input signal than the second decimation path. The device further comprises an offset compensation circuit configured to estimate an offset of the input signal by applying chopping to the second decimation path and to compensate the estimated offset in the first decimation path.

According to another embodiment, a method includes: applying a first window function to a first digital signal to generate a second digital signal, and applying a second window function to the first digital signal to generate a third digital signal, wherein a window length of the second window function is shorter than a window length of the first window function. The method further includes integrating the second digital signal or a signal derived therefrom to generate a fourth digital signal, and integrating the third digital signal or a signal derived therefrom to generate a fifth digital signal.

The above summary is merely intended to give a brief overview over some possible implementations and is not to be construed as limiting, as other implementations may comprise other features than the ones explicitly listed above.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

In the following, various embodiments will be described in detail referring to the attached drawings. It should be noted that these embodiments serve as illustrative examples only and are not to be construed as limiting. For example, while embodiments may be described as comprising a plurality of features or elements, in other embodiments some of these features or elements may be omitted and/or may be replaced by alternative features or elements. Additionally, apart from the features or elements explicitly shown and described, further elements or features may be provided.

In the embodiments shown and described, any direct connections or couplings between elements or components, i.e. connections or couplings without intervening elements, may also be implemented by indirect connections or couplings, i.e. connections or couplings comprising one or more additional intervening elements, as long as the general function of the connection or coupling, for example to provide a certain kind of signal, a certain kind of information or to provide a certain kind of control, is essentially maintained. In other words, connections or couplings may be modified as long as the function or purpose of the connection or coupling remains essentially the same.

Features from different embodiments may be combined to form further embodiments. Variations, modifications and details described with respect to one of the embodiments may also be applied to other embodiments.

Figure 1:
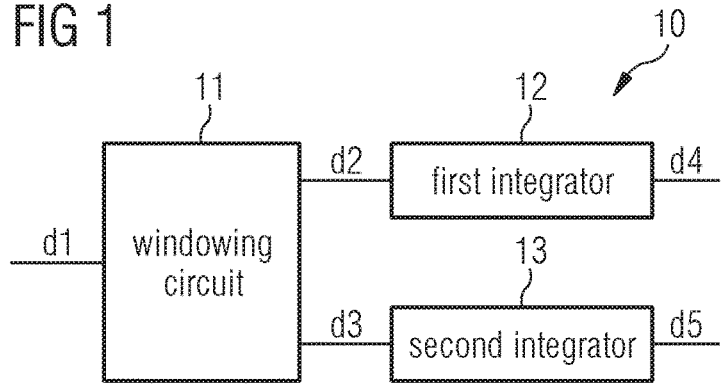
FIG. 1 is a block diagram of a decimation filter according to an embodiment.

Turning now to the Figures, FIG. 1 is a block diagram illustrating a decimation filter 10 according to an embodiment.

In the embodiment of FIG. 1, a digital signal d1 is provided to a windowing circuit 11. Digital signal d1 may be a one-bit stream provided by a sigma-delta analog-to-digital converter (ADC), but is not limited thereto and, in other embodiments, may be a multi-bit stream. Windowing circuit ii applies a first window function having a first window length to signal d1 to generate a digital signal d2 and applies a second window function having a second window length shorter than the first window length to signal d1 to generate a digital signal d3. Signals d2, d3 may each be multi-bit signals.

A window function as used herein generally provides weighting to a number of samples, the number of samples corresponding to the window length. In other words, through applying the window function, a number of samples of signal d1 corresponding to the respective window length are selected and weighted. To illustrate this further, a non-limiting example for applying a window function will be explained with reference to FIGS. 12A to 12C. It should be noted that the signals shown in FIGS. 12A to 12C are simple examples to illustrate the concept of windowing and are not to be construed as limiting in any way, as signals used and applied in various implementations may vary.

Figure 12A:
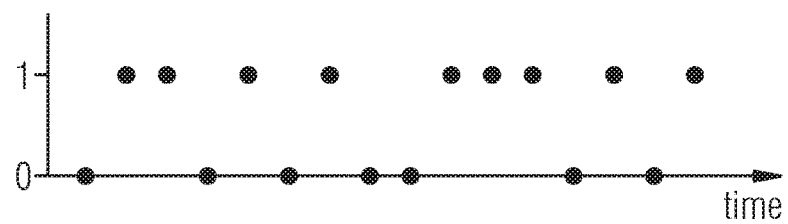
FIGS. 12A to 12C are diagrams illustrating windowing.

FIG. 12A shows an example of a one-bit stream over time with sample values of 0 and 1. FIG. 12B shows a simple example for a window function having a length of N=9 samples, i.e. has non-zero values over the length N. It should be noted that, in many implementations, a considerably larger window length, for example N=128 or N=256, may be applied, and the relatively short window length used in FIG. 12B is only for illustration purposes. The window function in FIG. 12B has a symmetric shape with a rising edge, a falling edge and constant values there between. Other window shapes are also possible. In particular, in embodiments, conventional window shapes like the Tuckey window, the Hamming window or the Hanning window may be used, but implementations are not limited to such conventional shapes.

Figure 12B:
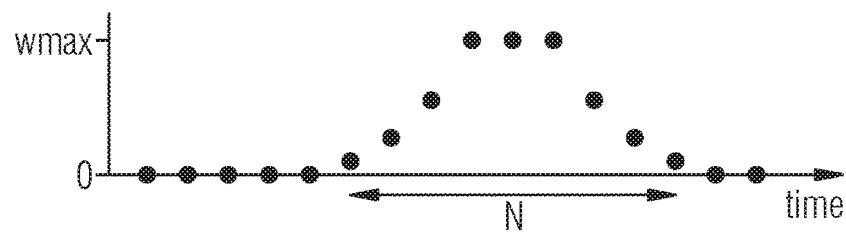
Figure 12C:
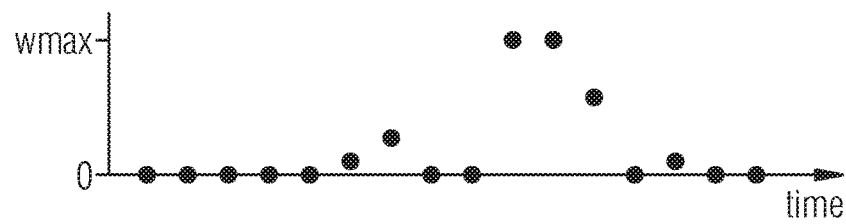

FIG. 12C illustrates the window function of FIG. 12B applied to the bit stream of FIG. 12A, i.e. the samples of the signal of FIG. 12A (0 or 1) are weighted (in this case, multiplied) with the corresponding values of the window function. It should be noted that, in case of a window function as shown in FIG. 12B with values between 0 and wmax and also intermediate values, which may be represented by multi-bit values, also the resulting signal as shown in FIG. 12C is a multi-bit signal.

Returning to FIG. 1, signal d2 of the decimation filter 10 is provided to a first integrator 12. First integrator 12 integrates the signal d2 over the first window length of the first window function. In a similar manner, signal d3 is provided to a second integrator 13 which integrates signal d3 over the second window length of the second window function. The application of the window functions and the integration are performed repeatedly, i.e. after a number of signal values corresponding to the first or second window length, the next values again have the window applied thereto.

After a number of samples corresponding to the respective window length (first window length for first integrator 12 and second window length for second integrator 13) have been integrated, the corresponding integrated value is output as signal d4 or d5, respectively, the respective integrator is reset and then the integration is again applied to the next window.

This process leads to a decimation of the signal, i.e. a reduction of the sampling rate, corresponding to the respective window length. In other words, signal d4 has a sampling rate corresponding to the sampling rate of signal d1 divided by the first window length, and signal d5 has a sampling rate corresponding to the sampling rate of signal d1 divided by the second window length.

By integrating over the (larger) first window length, signal d4 has a higher accuracy as signal d5. For example, noise effects may be better averaged out when integrating over a larger number of samples. On the other hand, due to the shorter second window length, signal d5 is provided faster than signal d4, in particular, signal d5 reacts to changes of a quantity represented by signal d1 faster than signal d4, as will be explained later in some more detail.

In some applications, signal d4 may therefore be used when a high precision is required, for example for control purposes, whereas signal d5 may be used for purposes where a fast reaction time is important, for example for error detection like short circuit detection. Therefore, in some implementations, by using the decimation filter of FIG. 1, both a high precision signal (for example signal d4) and a signal having a fast response to changes of signal d1 (for example signal d5) may be provided.

It should be noted that, while windowing circuit 11, first integrator 12 and second integrator 13 are shown as separate blocks in FIG. 1, they may be integrated in a common digital circuit like an application specific integrated circuit (ASIC) or may also be implemented by implementing a digital signal processor (DSP) accordingly.

It should be noted that, besides the integration, first integrator 12 and/or second integrator 13 may perform additional functions, for example modifying signal d2 or d3, respectively, prior to or after integration. Likewise, windowing circuit 11 may perform functions in addition to windowing to modify signal d1 before applying the respective window functions.

Figure 2:
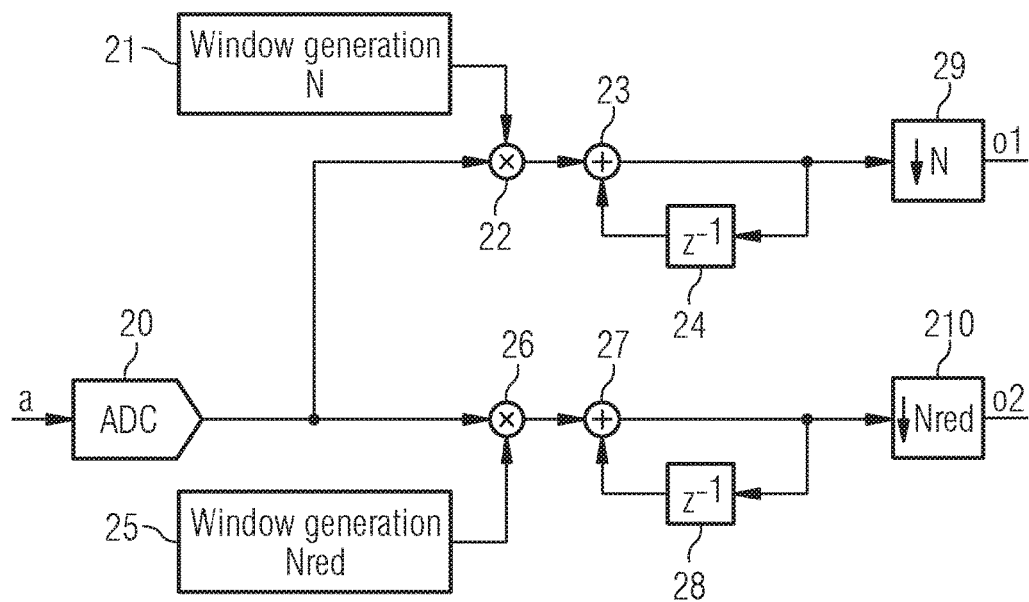
FIG. 2 is a diagram illustrating a decimation filter according to an embodiment.

FIG. 2 is a diagram illustrating a decimation filter according to an embodiment. In the embodiment of FIG. 2, an analog signal a is provided to an analog-to-digital converter 20. In some implementations, analog-to-digital converter 20 may be a sigma delta analog-to-digital converter outputting a one-bit stream. The one-bit stream thus generated is provided to a first input of a first multiplier 22 and a first input of a second multiplier 26.

A window generation circuit 21 provides a first window function having a length N to a second input of first multiplier 22. Window generation circuit 21 may, for example, use a function stored in a memory or may generate a window function based on stored coefficients and interpolation, as will be explained in more detail referring to FIG. 3. First multiplier 22 then multiplies the generated window function with the output signal of analog-to-digital converter 20 in a sample-by-sample manner to perform windowing, as has been explained using an example referring to FIGS. 12A to 12C above. An output signal of first multiplier 22 is provided to a first input of an adder 23. An output of adder 23 is fed back to an input of adder 23 via delay element 24. Delay element 24 together with adder 23 therefore forms an integrator and integrates the output of multiplier 22 over the window length N and is read out and reset after each N samples to output a decimated signal oi decimated by N, similar to what has been explained referring to FIG. 1. This process is represented by block 29 with a decimator symbol in FIG. 2.

Furthermore, a window having a window length Nred is provided by a window generation circuit 25 to a second input of second multiplier 26. Second window length Nred, in the example of FIG. 2, is shorter than first window length N. In some examples, N may be an integer multiple of Nred. To give a non-limiting example, N may be 256, and Nred may be 128, although other values may also be used. In particular, N may, but need not be, an integer multiple of Nred. An output signal of second multiplier 26 is provided to an integrator formed by an adder 27 and a delay element 28, similarly to the integrator formed by adder 23 and delay element 24 explained above. The integrator formed by adder 27 and delay element 28 integrates over Nred samples and is read out and reset thereafter to output a decimated signal 02 decimated by a decimation factor of Nred, as represented by block 210 with a decimator symbol in FIG. 2.

Signal 01 as it is integrated over N samples may have a higher precision than signal 02 which is integrated only over Nred samples. On the other hand, output signal 02 may have a faster response to changes of signal a than signal 01.

In FIG. 2 separate window generation circuits 21, 25 are provided for generating windows having different lengths. In other embodiments, parts of window generation circuit 21 and 25 may be implemented together, which, in some implementation, may reduce a needed circuit area. An example will be explained referring to FIG. 3.

Figure 3:
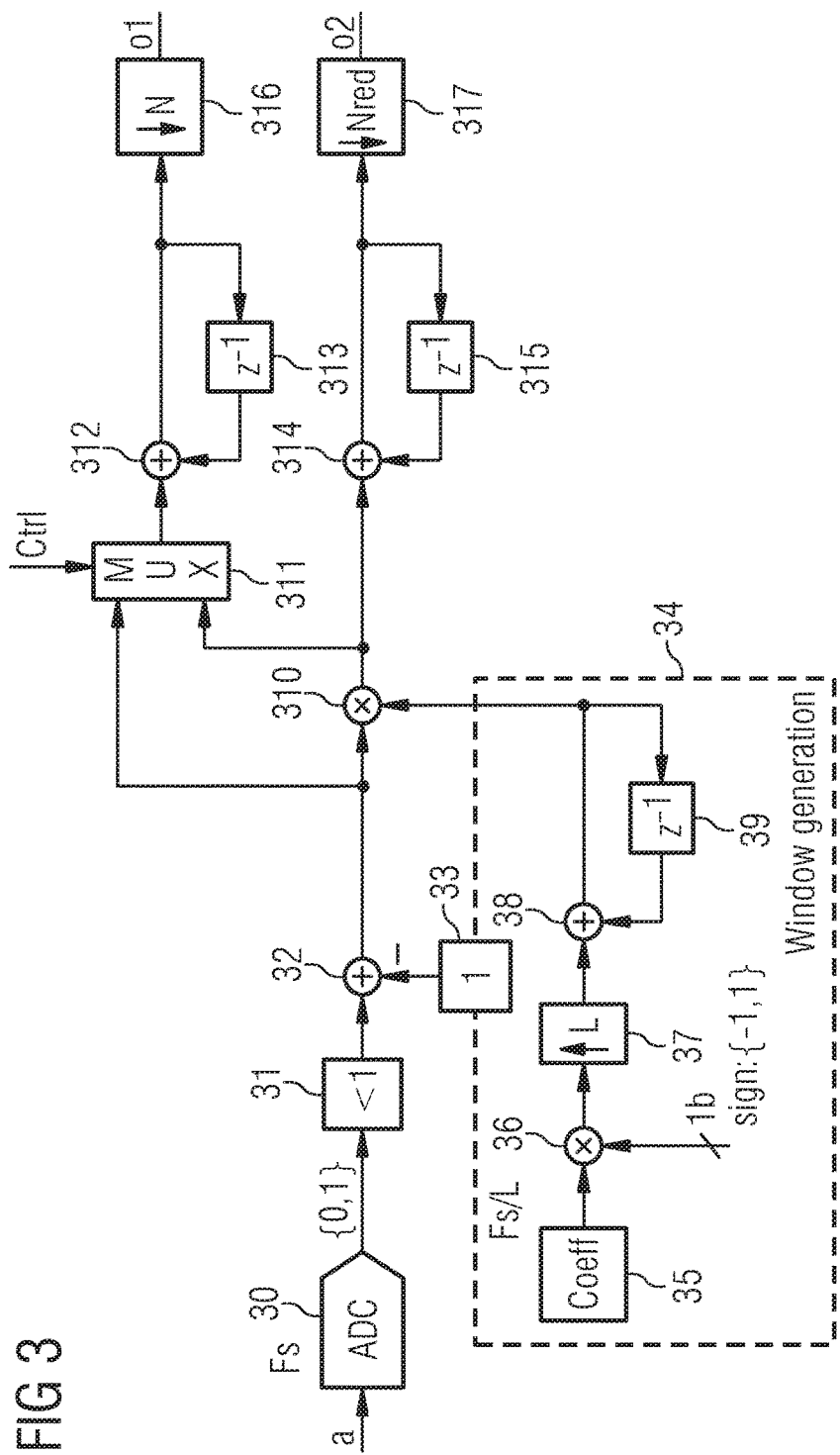
FIG. 3 is a diagram illustrating a decimation filter according to a further embodiment.

In FIG. 3, an analog input signal is provided to an analog-to-digital converter 30. In the example of FIG. 3, analog-to-digital converter 30 is a sigma delta converter outputting a one-bit stream containing zeros and ones with a sampling frequency Fs. In the embodiment of FIG. 3, this bit stream is then shifted by one bit in a bit shifter 31. Through this shifting, a bit stream having values of zero and two (bit one shifted to one position to the left) result. From these bits, in a subtractor 32, a value of one stored e.g. in a memory 33 is subtracted, resulting in a bit stream having values of +1 and −1. In other words, elements 31, 32 and 33 convert the bit stream having values 0, 1 to a stream of values +1, −1, i.e. values symmetric to 0. It should be noted that such an operation may also be applied to signal d1 in FIG. 1 before providing it to windowing circuit 11 or to the output signal of analog-to-digital converter 20 of FIG. 2 before providing it to multipliers 22, 26 in FIG. 2.

Furthermore, the decimation filter of FIG. 3 comprises a window generation circuit 34 which generates window functions based on coefficients stored in a storage 35 (for example read only memory, flash memory, hard wired storage or the like) and interpolation. Window generation circuit 34 in the example of FIG. 3 is adapted to generate a rising edge and a falling edge of a window (see for example the example rising edge and falling edge in FIG. 12B). For the rising edge, in a multiplier 36, the coefficients are multiplied by +1 and for the falling edge they are multiplied by −1. The coefficients are output with a rate Fs/L and at 37 the sampling frequency is increased by L by repeating coefficient values. L may, for example, be 4, and a number of coefficients may be 8, which results in a length of falling edge and rising edge of 128 samples, i.e. Nred=128. The output values are integrated by an integrator formed by an adder 38 and a delay element 39, which corresponds to a linear interpolation between coefficients.

The thus generated window function is provided to a multiplier 310.

The output of subtractor 32, i.e. the bit stream of −1 and 1 is also provided to multiplier 310. Therefore, in multiplier 310, the samples output by subtractor 32 are subjected to windowing. An output of multiplier 310 is provided to an integrator formed by an adder 314 and a delay element 315 to generate an output signal 02. In particular, the integrator 314, 315 integrates Nred samples, wherein Nred is the length of the window generated by window generation circuit 34, and is reset thereafter, such that signal 02 is decimated by factor of Nred, as represented by a block 317 with a decimator symbol.

Furthermore, the output of multiplier 310 is provided to a first input of a multiplexer 311. The output of subtractor 32 is provided to a second input of multiplexer 311. To provide an output signal 01 having a higher resolution, multiplexer 311 forwards the output of multiplier 310 during a rising edge of the window function generated by window generation circuit 34. After this, multiplexer 311 for M*Nred samples outputs the signal output by adder 32 to integrator 312 scaled by a maximum value of the window function (e.g. wmax in FIG. 12). M is an integer number, i.e. M=1, 2, 3 . . . Following these samples, multiplexer 311 forwards the output of multiplier 310 during a falling edge of the window function generated by window generation circuit 34. Through this operation of multiplexer 311, effectively a window of length (M+1)*Nred is applied to the samples output by subtractor 32, where this larger window has rising and falling edges corresponding to the window output by window generation circuit 34 with M*Nred constant samples (maximum of window function) inserted therebetween. In other words, instead of providing a first and second window function separately, in FIG. 3, the window output by window generation circuit 34 is used as the second window function directly (the output of multiplier 310 is provided to integrator 314, 315) and is used for applying the first window function by first applying a rising edge (first part) of the window function provided by window generation circuit 34, followed by scaled samples of the signal output by adder 32 (using multiplexer 311), followed by applying a falling edge (second part) of the window function. Integrator 312, 313 is read out and reset after each window of (M+1)*Nred samples to output signal 01, which is decimated by a factor of N=(M+1)*Nred, as represented by a block 317 having a decimator symbol. To achieve this, multiplexer 311 is controlled by a control signal Ctrl.

Signal 01 therefore results from applying a larger window function (length (M+1)*Nred), whereas signal 02 results from using a shorter window function (length Nred) similarly to the previously discussed embodiments of FIGS. 1 and 2.

Therefore, similarly to previously discussed embodiments, signal 01 may have a higher precision due to integration over more samples, whereas signal 02 may have a faster response to changes in the analog input signal of ADC 30.

For example, in some implementations, signal 01 of FIGS. 2 and 3 or signal d4 of FIG. 1 may have a resolution of about 13 bits ENOB (effective number of bits), whereas signal 02 of FIGS. 2 and 3 or signal d5 of FIG. 1 may have a lower resolution of 5 to 7 bits ENOB. However, these values serve merely as examples and may depend on the length of the windows used and on the particular implementation.

It should be noted that the generation of a window function based on coefficients and interpolation shown in FIG. 3 may also be used in other embodiments, for example in windowing circuit 11 of FIG. 1 or window generation circuit 21 and/or 25 of FIG. 2.

Figure 4:
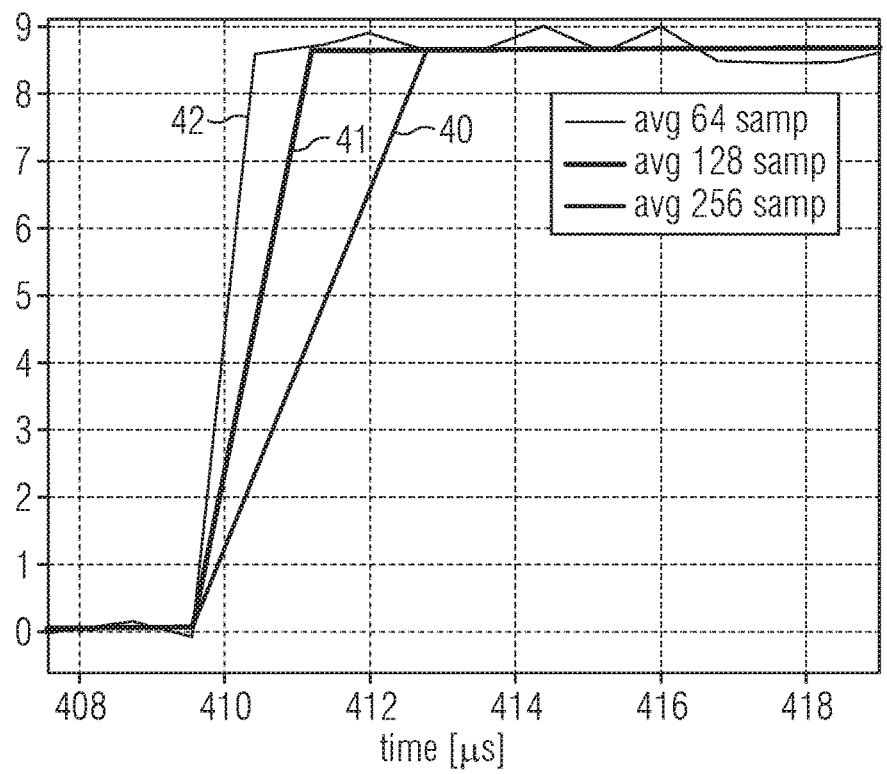
FIG. 4 is a diagram used for explaining operation of decimation filters according to some embodiments.
Figure 5:
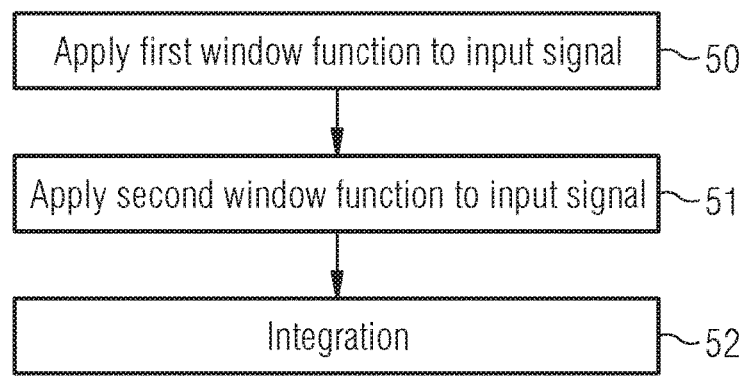
FIG. 5 is a flowchart illustrating a method according to an embodiment.

FIG. 5 is a diagram illustrating the accuracy and response time of decimation filters as discussed previously for different window lengths. In particular, curves 40 to 42 of FIG. 4 illustrate an output of an integrator of a decimation filter like the integrators discussed with reference to FIGS. 1-3 for different window lengths over time. In particular, curves 40-42 illustrate a response to a change of an analog input signal like signal a of FIGS. 2 and 3. Curve 40 shows the response for a window length of 256 samples, curve 41 illustrates the response for a window length 128 samples and curve 42 shows the response for a window length of 64 samples. As can be seen, with a shorter length, a faster response is obtained. Therefore, with a short window length, for example a fast detection of errors may be achieved. On the other hand, as can be seen for short window lengths the output signal fluctuates (best seen in curve 42), whereas for longer window length after the response time has passed the signal is more stable. Therefore, a higher window length yields more accurate results. As discussed above, in embodiments as shown may be used to provide both a fast response (for example in signal d5 or o2) and a high precision (for example in signals o1 and d4).

FIG. 5 is a flow chart illustrating a method according to an embodiment. For ease of understanding, the method of FIG. 5 will be described referring to the previously described embodiments of FIGS. 1 to 4, also to avoid repetitions. However, it should be noted that the method of FIG. 5 may also be implemented using other decimation filters like the one explicitly shown and described referring to FIGS. 1 to 4.

Furthermore, while the method of FIG. 5 is depicted as a series of acts or events, the order in which these acts or events are shown and described is not to be construed as limiting. In particular, some of the acts or events may be performed in parallel, for example in different parts of a circuit.

At 50 of FIG. 5, the method comprises applying a first window function to an input signal, and at 51, the method comprises applying a second window function to the input signal, where the second window function has a shorter window length than the first window function. Examples for this have been discussed referring to FIGS. 1 to 4 and 12, for examples first window function with length N and second window function with length Nred in FIG. 2.

At 52, the method comprises integrating the result of the application of the first window function at 50 over the window length of the first window function to generate a first output signal, and integrating the result of applying the second window function over the window length of the second window function to generate a second output signal. Examples also have been discussed referring to FIGS. 1 to 3 for example integration to generate first and second output signals d4, d5 of FIG. 1 or o1, o2 of FIGS. 2 and 3. In this way, as also discussed a first output signal having a high precision and a second output signal having a fast response to changes of the input signal may be obtained.

In some cases, the analog-to-digital conversion by analog-to-digital converter 20 of FIG. 2 or analog-to-digital converter 30 of FIG. 3 or other circuit parts may introduce an offset in the signal. For some applications, such an offset may be not desirable. For example, in some cases such an offset may adversely affect a control based on the output signal of the decimation filter. Therefore, in some embodiment techniques for compensation of such an offset are provided, examples for which will be discussed next referring to FIGS. 6 to 11.

In some of the embodiments that will be discussed next, an offset is estimated based on a signal path having a shorter window length and therefore a faster response to changes of the input signal as explained above, and this estimated offset is then used for offset compensation of a signal output by a signal path having a longer window length.

Figure 6:
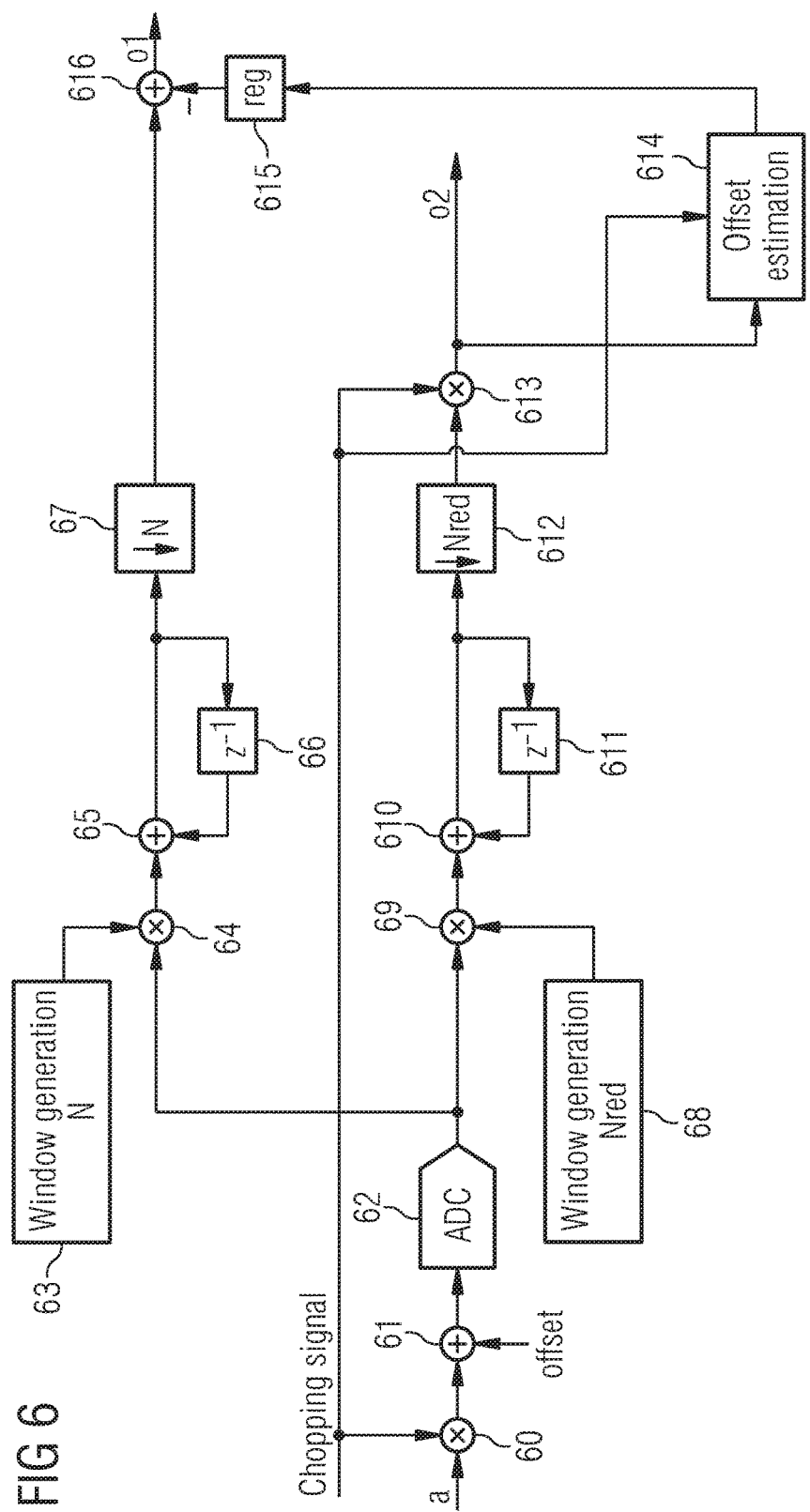
FIG. 6 is a diagram illustrating a decimation filter according to an embodiment.

FIG. 6 is a diagram illustrating a decimation filter using offset compensation according to an embodiment. The decimation filter of FIG. 6 is to some extent based on the decimation filter of FIG. 3, and in order to avoid repetitions when explaining the embodiment of FIG. 6 reference will be made to the explanation made for FIG. 2. It should be noted that the offset compensation described with respect to FIG. 6 may also be applied to the embodiments of FIGS. 1 and 3. Variations and modifications explained referring to FIGS. 1 to 3 may also be applied to the embodiment of FIG. 6.

The device of FIG. 6 receives an analog input signal a. A chopping signal is applied to analog signal a by a multiplier. A chopping signal is usually a signal with alternating sign for example a signal changing between values of +1 and −1 periodically. This "chopped" signal is provided to an analog-to-digital converter 62, for example a sigma delta analog-to-digital converter, which may correspond to converter 20 of FIG. 2.

Analog-to-digital conversion by analog-to-digital converter 62 or other signal processing may cause an offset. In FIG. 6, this offset is represented by an offset added by an adder 61. It should be noted that this adder 61 is no explicit part of the circuit, but is used as a representation for adding the offset, and the offset may be for example added during the conversion in the analog-to-digital converter 62.

The output signal of analog-to-digital converter 62 is provided to a multiplier 64 where it is multiplied by a first window function having a length N generated by a window generation circuit 63, and an output of multiplier 64 is provided to an integrator comprising an adder 65 and a delay element 66. Operation and configuration of window generation circuit 63, multiplier 64, adder 65 and delay element 66 may correspond to window generation circuit 21, multiplier 22, adder 23 and delay element 24 of FIG. 2, respectively, and all the explanations made with reference to FIG. 2 may also be applied to the corresponding elements of FIG. 6. Integrator 65, 66, as has been explained referring to FIG. 2, is read out and reset every N samples corresponding to the window length, leading to a decimation by a factor N as symbolized by decimation symbol 67. In addition, the output of analog-to-digital converter 62 is provided to a multiplier 69 to be multiplied with a second window function having a length Nred smaller than N generated by window generation circuit 68. An output of multiplier 69 is fed to an integrator formed by an adder 610 and a delay element 611 as shown in FIG. 6. Window generation circuit 68, multiplier 69, adder 610 and delay element 611 may operate as described with respect to FIG. 2 for window generation circuit 25, multiplier 26, adder 27 and delay element 28, respectively.

As also explained referring to FIG. 2, an output of integrator 610, 611 is read out after Nred samples and reset, leading to a decimation by a factor Nred as symbolized by decimation symbol 612.

An output of the thus generated output of integrator 610, 611 is provided to a multiplier 613 to be multiplied by the chopping signal. An output of multiplier 613 is output as output signal 02 which, as a reduced window length Nred is used, has a relatively fast response to changes of analog input signal a as explained previously. Furthermore, the output of multiplier 613 is provided to an offset estimation circuit 614. Offset estimation circuit 614 in addition receives the chopping signal.

Offset estimation 614 estimates a value for the offset added to the signal, as symbolized by adder 661. Through the chopping signal, as explained the sign of signal a is periodically changed at multiplier 60. Therefore, the chopping signal may change corresponding to the sampling frequency of the signal read from integrator 610, 611, i.e. the sampling frequency of ADC 662 divided by Nred. In this case, successive values of signal 02 alternatingly have the offset added and subtracted. For example, a value 02,1 of signal 02 may have the offset added (02,1=02,1'+offset), and a following value 02,2 may have the offset subtracted (02,2=02,2'−offset), wherein 02,1' and 02,2' are the signal values without the offset respectively. In case there are no abrupt changes in the output signal, the offset may then be estimated by subtracting successive signal values, i.e. an offset estimation of may be calculated according to offset= (02,1−02,2)/2.

This estimated offset is then stored in a register 615 and subtracted from the output signal of integrator 65, 66 at a subtractor 616, to output an offset compensated signal 01 with high precision.

Therefore, in the embodiment of FIG. 6 the signal 02 generated by using a reduced window length and which therefore has lower accuracy but faster response time as explained is used for estimating an offset, which then in turn is used to compensate an offset in signal 01 which has been generated using a larger window length.

It should be noted that in embodiments the chopping is deactivated when an actual measurement to obtain 01 is performed. In other words, the offset estimation in such an embodiment is performed during times where signal 01 is not needed, as applying the chopping signal may adversely affect the accuracy of signal 01 in some implementations.

Furthermore, in the embodiment of FIG. 6 the offset in signal 02 is not compensated. In many applications, this is not necessary as signal 02 is for example used for detecting errors, like short circuits, for which no precise measurements are necessary and therefore the offset may be acceptable.

Variations and additions to the embodiment of FIG. 6 will now be described referring to FIGS. 7 and 8. To avoid repetitions, elements already described with reference to FIG. 6 bear the same reference numerals in FIGS. 7 and 8 as in FIG. 6 and will not be described in detail.

As mentioned above, the offset compensation of FIG. 6 assumes that successive values output by integrator 610, 611 do not change significantly, such that the offset may be estimated. In the embodiment of FIG. 7, a possible slew rate of the signal values is additionally estimated and taken into account for the offset estimation. In other words, a slew rate (change rate) of the signal is estimated.

Figure 7:
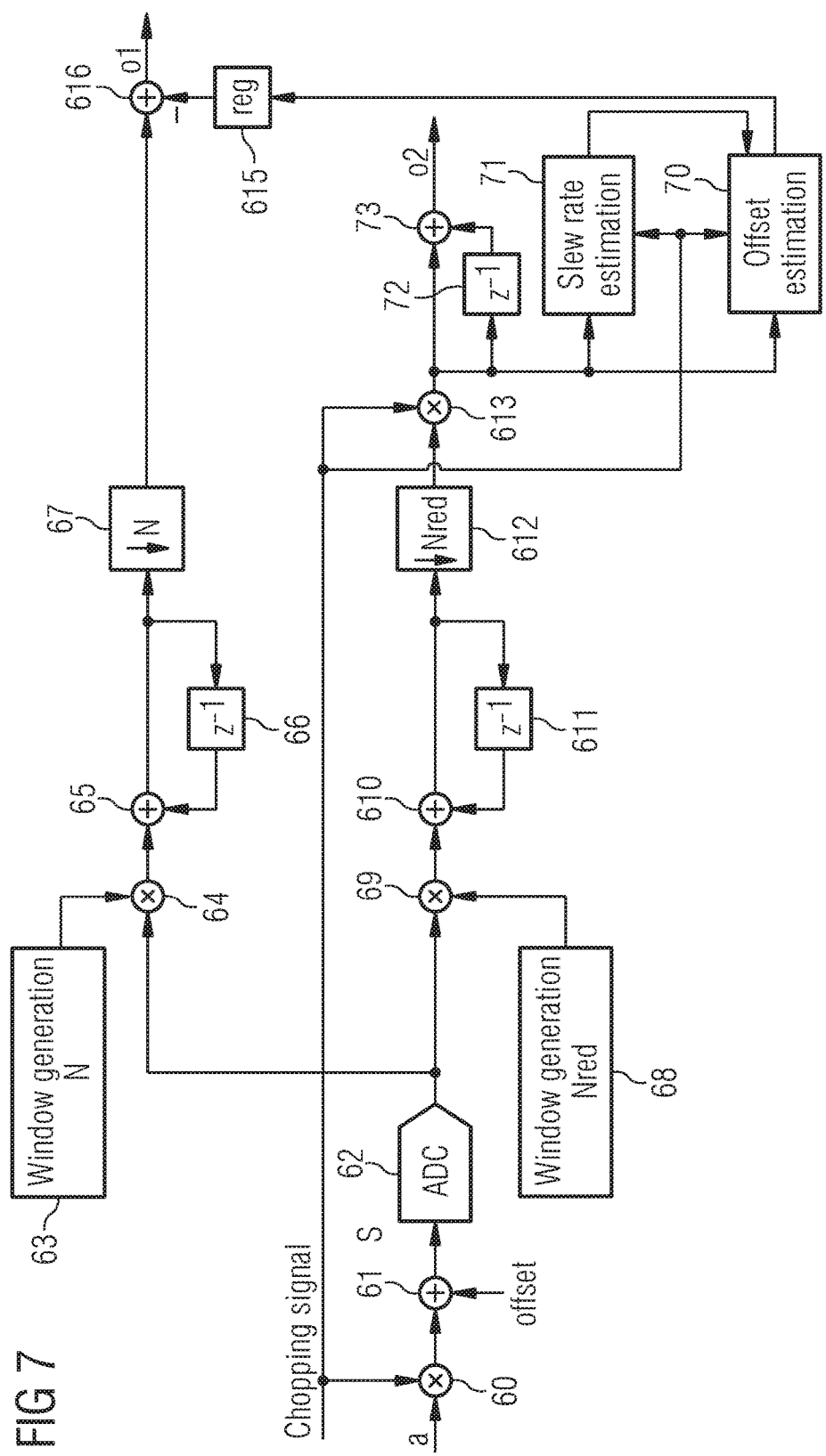
FIG. 7 is a diagram illustrating a decimation filter according to an embodiment.

For this, in FIG. 7, a slew rate estimation circuit 71 is provided. For example, slew rate estimation circuit 71 may compare every other value output by integrator 610, 611 to determine a slew (every other value has the same sign of the chopping signal applied and therefore any slew is not due to the offset, but due to a changing signal). For example, based on these values, slew rate estimation circuit 71 may extrapolate a following value, e.g. by linear extrapolation. This slew rate may then be taken into account in an offset estimation circuit 70 to estimate the offset more precisely.

In addition, in FIG. 7, the offset is also compensated in the signal output by integrator 610, 611. To this end, in an adder 73, each signal value output by multiplier 613 is added to the previous signal value (delayed by a delay element 72). In other words, successive values are added. As in successive signal values the offset is once added with a positive sign and once with a negative sign as explained above, adding the two values essentially compensates the offset.

It should be noted that the various additions of FIG. 7 (offset compensation for signal 02, slew rate compensation of signal 02 and taking into account the slew rate for the offset estimation for signal 01) may be implemented independently from each other and need not be implemented together.

Figure 8:
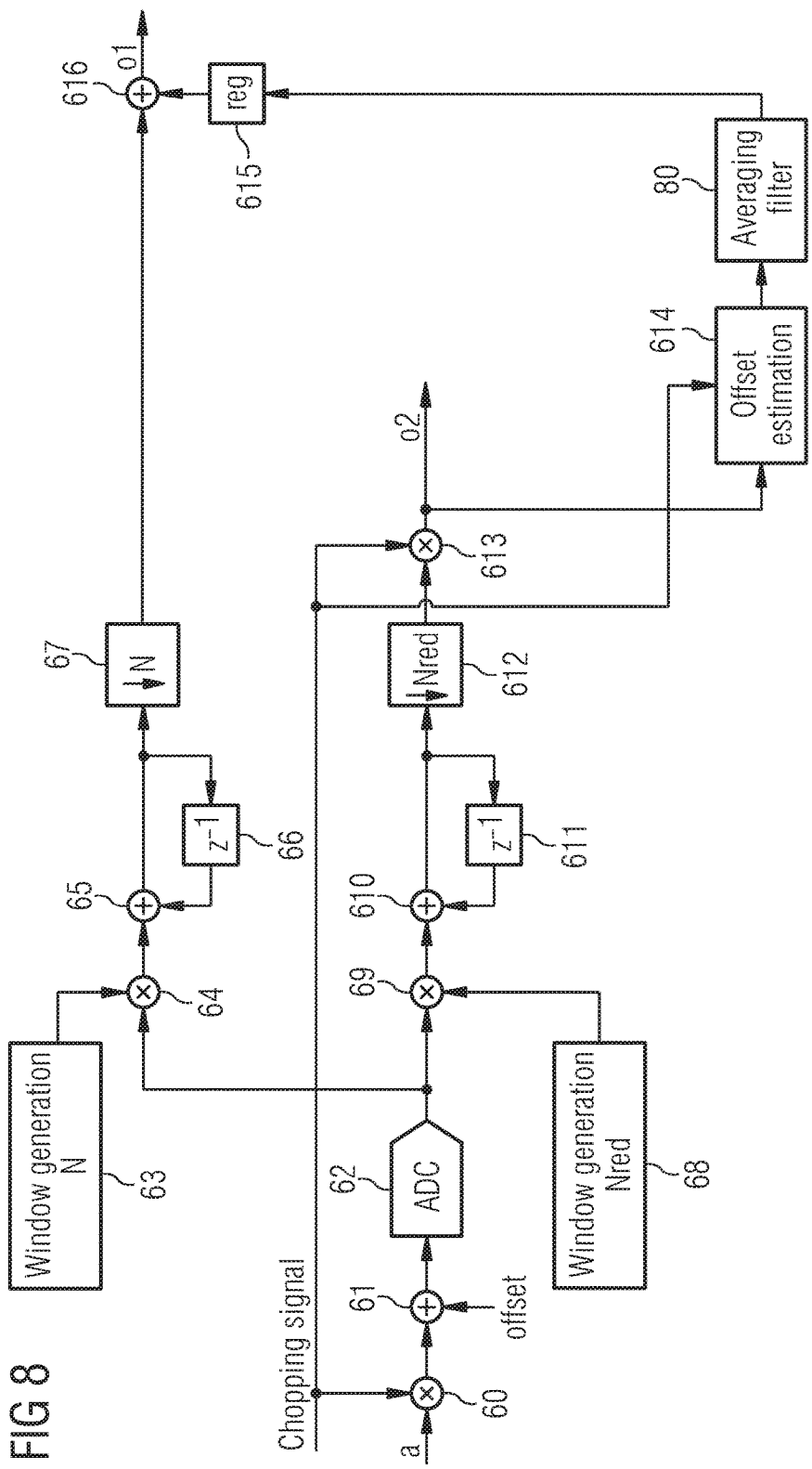
FIG. 8 is a diagram illustrating a decimation filter according to an embodiment.

A further variation which may be implemented together with the variations illustrated in FIG. 7, but may also be implemented without them, is shown in FIG. 8. In FIG. 8 the offset estimated by offset estimation 614 described with respect to FIG. 6 is provided to an averaging filter 80, which averages the estimated offset over a plurality of estimated values. In many cases, an offset of a system does at least not change rapidly, such that an averaging over a plurality of values may improve accuracy by averaging out noise caused for example by noise sources in an environment of the decimation filter. Such a filter may be implemented as a hardware filter, but may also be implemented in software. In some implementation the offset averaging may be synchronized with an application, for example a motor-drive control using several phases. In such an implementation, a single decimation filter may be used for more than one phase using e.g. a multiplexer, and the offset averaging may be synchronized with switching between the phases, so that the offset is estimated only based on signals within one phase.

Figure 9:
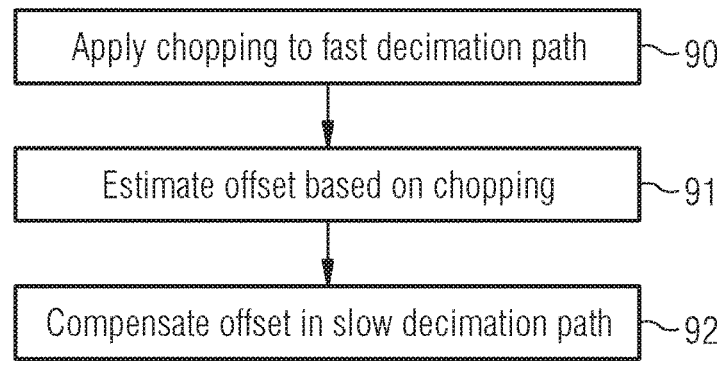
FIG. 9 is a flowchart illustrating a method according to an embodiment.

FIG. 9 is a flow chart illustrating a method according to an embodiment. For ease of reference, the method of FIG. 9 will be described referring to the decimation discussed with reference to FIGS. 6 to 8. However, the method of FIG. 9 may also be used independently from these decimation filters. Also, while the method is described as a series of acts or events, the order in which the acts or events are described is not to be construed as limiting.

At 90, the method comprises applying chopping to a fast decimation path. A fast decimation path is a decimation path with a comparatively fast response to changes of the input signals, in contrast to a slow decimation path described further below. In FIGS. 6 to 8, the fast decimation paths are those outputting signal 02.

In particular, as illustrated in FIGS. 6 to 8 applying the chopping may comprise applying a chopping signal to an analog input signal and to a signal output by an integrator of the fast decimation path.

At 91, the method comprises estimating an offset based on the chopping, i.e. based on the output signal of the fast decimation path to which chopping is applied. Estimating an offset may be based on consecutive samples output by the fast decimation path as explained above, and additionally may comprise averaging and/or may take slew into account as also explained above.

At 92, the estimated offset is compensated in a slow decimation path, i.e. a path giving an output signal having a slower response to changes in the input signal, but having a higher accuracy. Examples for slow decimation paths include the path outputting signal 01 in FIGS. 6 to 9.

In addition, the method may also comprise compensating an offset in the fast decimation path, as shown in FIG. 7.

Next, the techniques discussed with reference to FIGS. 6 to 9 for offset estimation will be further illustrated using simulations referring to FIGS. 10 and 11.

For this simulation, an analog sigma analog-to-digital converter having second order and operating at a sampling frequency fs of 80 MHz was assumed outputting a single bit stream. An analog offset (offset added before the analog-to-digital converter as shown in FIGS. 6 to 8) having a value of 1 mV was used. Nred was 64, and for an averaging as shown in FIG. 8 a first order comb filter having a length of 16 was used.

Figure 10:
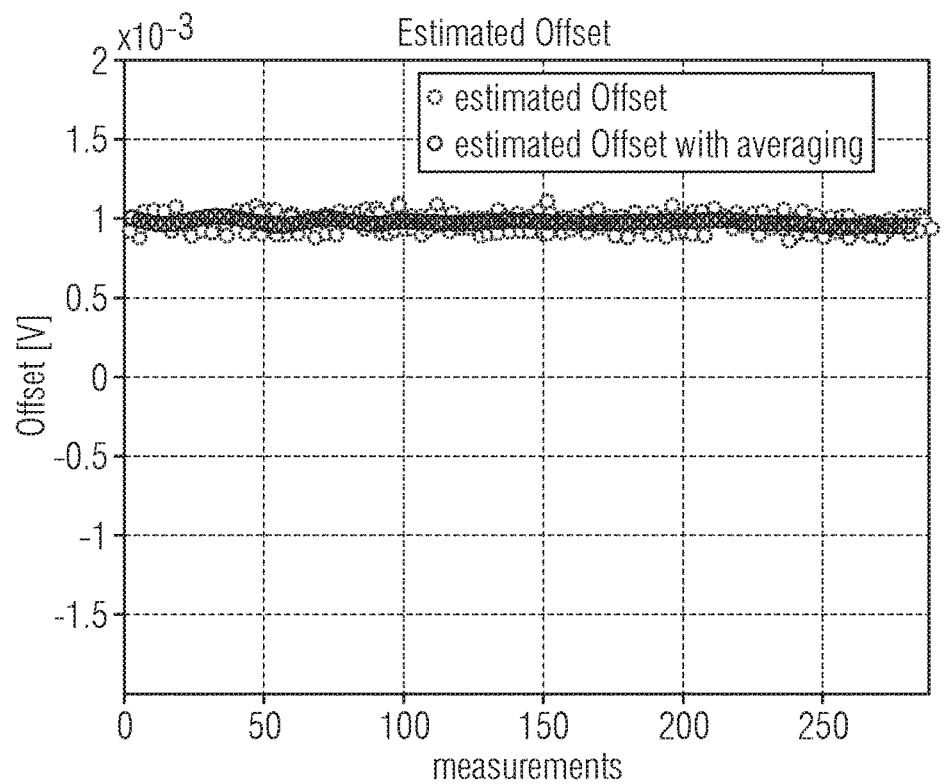
FIGS. 10 and 11 are diagrams illustrating operation of some embodiments.

FIG. 10 illustrates the estimated offset with and without averaging. As can be seen, a noise, in particular quantizing noise, of the estimated offset is reduced by the average filtering.

For simulating the effect of a slew in the signal and of slew estimation (71 in FIG. 7), a sinusoidal input signal was used. FIG. 11 shows the estimated offset with and without slew rate estimation. Without slew rate estimation, the sinusoidal input signal is reflected in the estimated offset, while with the slew rate estimation the effect of the slew is essentially eliminated.

Figure 11:
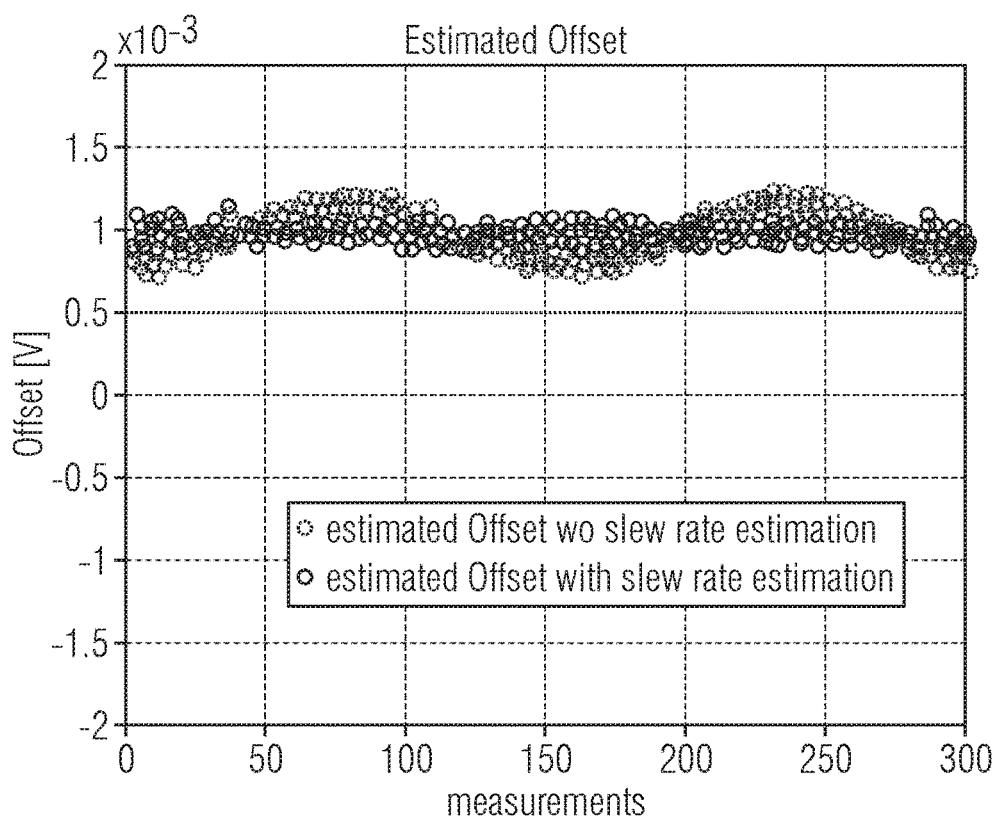

It should be noted that the values and representations of FIGS. 10 and 11 serve merely for further illustration and are not to be construed as limiting.

Decimation filters as explained above may be used in a variety of applications. An example application is a control for a motor, where current values are measured and provided as digital signals to a controller. These digital signals may be provided by oversampling sigma delta converters and then decimated by decimation filters, as explained above. In such cases, the signal obtained using a longer window length (for example, signals d4, o1 in the above described embodiments) may be used for the control, whereas the signal generated using a shorter window length (for example, signals d5, o2 in the above described embodiments) may be used for error detection.

Figure 13:
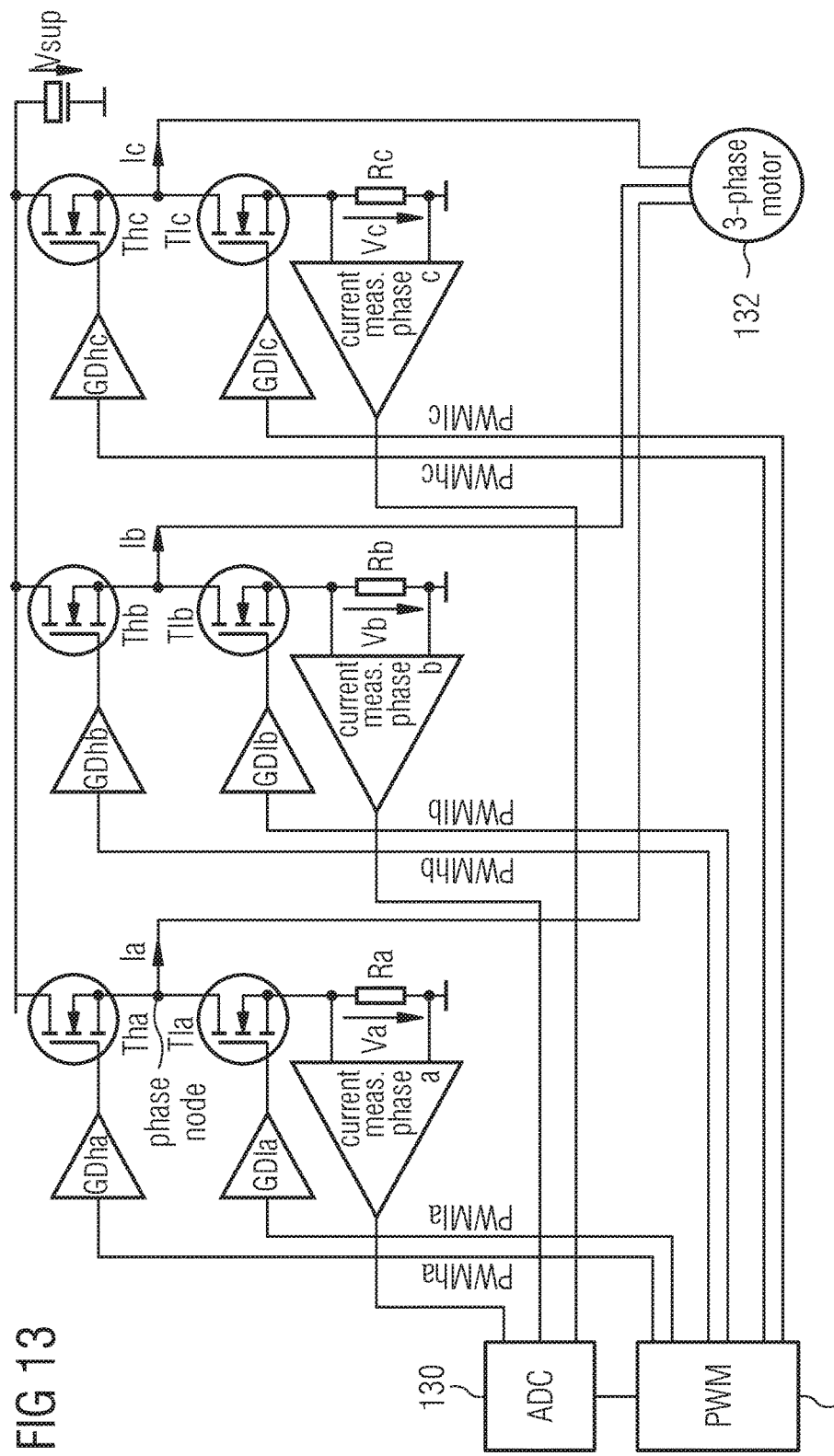
FIG. 13 illustrates a motor as an example environment where embodiments may be applied.

FIG. 13 illustrates an example of a control circuit controlling a three-phase motor 132. Three pairs of switches Tha, Tla; Thb, Tlb; Thc, Tlc, respectively, generate output currents Ia, Ib and Ic for the three phases of three-phase motor 132, respectively. The switches are controlled via respective drivers by a pulse width modulation (PWM) controller 131 using signals PWMha, PWMla for the first pair of switches Tha, Tla, PWMhb, PWMlb for the second pair of switches Thb, Tlb and PWMhc, PWMlc for the third pair of switches Thc, Tlc. Shunt resistors Ra, Rb, Rc are used for measuring the currents Ia, Ib and Ic for the three pairs of switches, also referred to as phases. The measurement results are provided to one or more analog-to-digital converter(s) 130. Analog-to-digital converter(s) 130 may be sigma delta converters with a decimation filter arrangement as explained above with reference to FIGS. 1 to 12. In some embodiments, separate analog-to-digital converters and decimation filters may be provided by the three phases, and, in other embodiments, a single analog-to-digital converter and decimation filter may be used together with a multiplexer.

Figure 14:
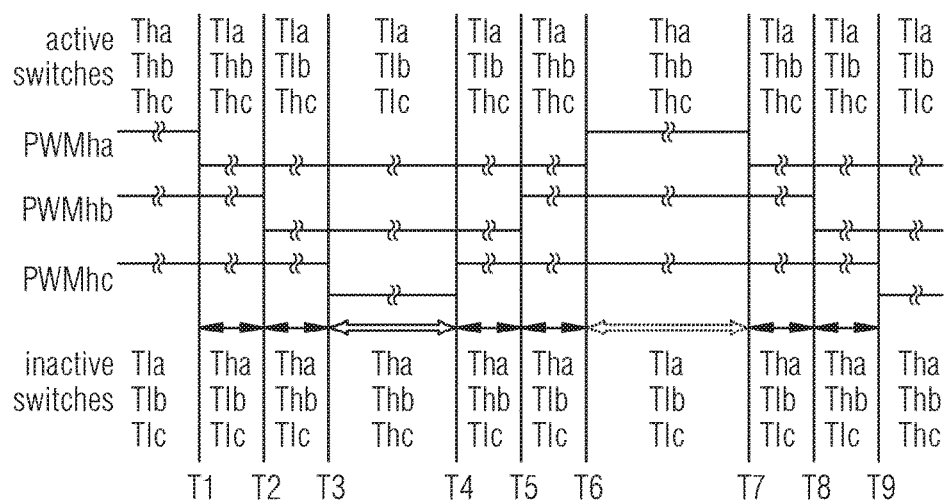
FIG. 14 shows example signals in the motor of FIG. 13.
Figure 15:
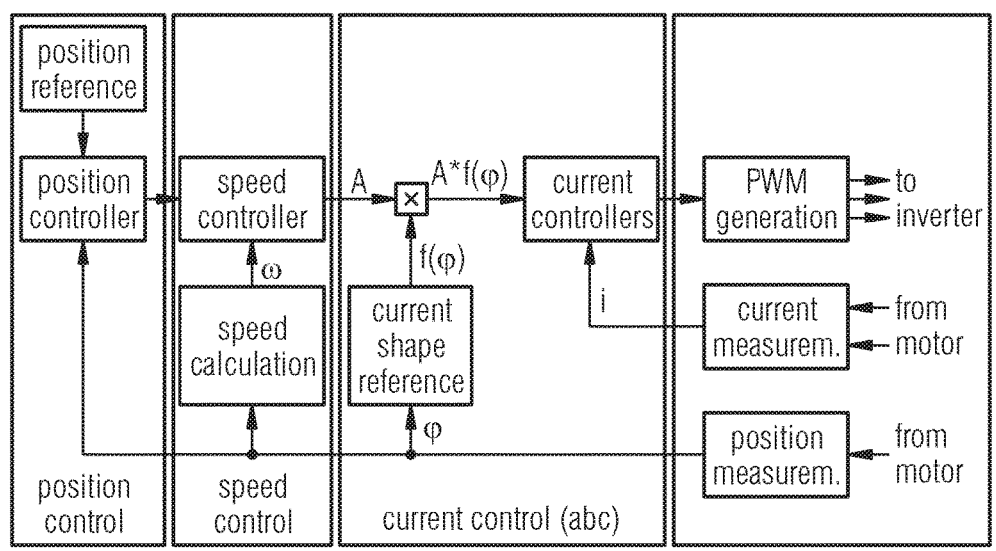
FIG. 15 illustrates an example for a motor control scheme where embodiments may be applied.

FIG. 14 illustrates examples for the signals shown in FIG. 13. The on-time of the switches in some embodiments may be regulated based on the current measurements and, in addition, also based on position measurements of the motor. FIG. 15 illustrates an example controller like PWM controller 131 of FIG. 1. In particular, the current measurement from motor or position measurement may use analog-to-digital converter and decimation filters as explained above. In such applications, an offset compensation as explained above may be desirable, as an offset may lead to the motor not being operated at the correct operation point.

In addition, the signal from respective fast decimation path (signals d5, o2 in the embodiments above) may be used for error detection, for example by comparing the value with a threshold and detecting an error when the signal value (value of signals d5 or o2) exceeds a threshold indicating an overcurrent or short circuit.

The following examples are example embodiments of the invention.

EXAMPLE 1

A device, comprising: a windowing circuit configured to apply a first window function to a first digital signal to generate a second digital signal and to apply a second window function to the first digital signal to generate a third digital signal, wherein a window length of the first window function is longer than a second window length of the second window function, a first integrator configured to receive the second digital signal, and a second integrator configured to receive the third digital signal.

EXAMPLE 2

The device of example 1, wherein the first window length is an integer multiple of the second window length.

EXAMPLE 3

The device of example 1 or 2, wherein a sampling rate of a fourth digital signal output by the first integrator and a fifth digital signal output by the second integrator is lower than a sampling rate of the first digital signal.

EXAMPLE 4

The device of any one examples 1-3, wherein at least one of the first window function and the second window function is selected from the group consisting of a Tuckey window, a Hamming window or a Hanning window.

EXAMPLE 5

The device of any one of examples 1-4, wherein the windowing circuit comprises a window function generator configured to generate at least one of the first and second window function based on an interpolation between supporting points.

EXAMPLE 6

The device of any one of example 1-5, wherein the windowing circuit comprises a window function generator configured to generate the second window function, wherein the windowing circuit is configured to apply the first window function by: applying a first part of the second window function to generate first samples of the second digital signal, followed by scaling samples of the first digital signal by a maximum value of the second window function to generate second samples of the second digital signal following the first samples, followed by applying a second part of the second window function to generate third samples of the second digital signal following the second samples.

EXAMPLE 7

The device of any one of examples 1-6, wherein the windowing circuit further comprises a multiplier, wherein a first input of the multiplier is arranged to receive the first digital signal, wherein a second input of the multiplier is coupled to an output of the window function generator, and wherein an output of the multiplier is coupled to an input of the second integrator and to a first input of a multiplexer, wherein a second input of the multiplexer is arranged to receive the first digital signal, wherein an output of the multiplexer is coupled to an input of the first integrator.

EXAMPLE 8

The device of any one of examples 1-6, further comprising an evaluation circuit configured to control a further device based on an output of the first integrator and to detect a malfunction based on an output of the second integrator.

EXAMPLE 9

The device of any one of examples 1-8, further comprising: an analog-to-digital converter configured to output the first digital signal based on a received analog signal, a chopping circuit configured to apply a chopping signal at an input of the analog-to-digital converter and at an output of the second integrator, and an offset compensation circuit configured to estimate an offset of the first digital signal based on an output signal of the second integrator and the applied chopping signal, and to compensate the estimated offset in an output signal of the first integrator.

EXAMPLE 10

The device of example 9, wherein the offset compensation circuit is configured to perform an averaging of the estimated offset.

EXAMPLE 11

The device of example 9 or 10, wherein the offset compensation circuit is configured to estimate a slew rate of the output signal of the second integrator and to estimate the offset based on the estimated slew rate.

EXAMPLE 12

A device, comprising: a first decimation path configured to provide a first decimated signal based on an input signal, a second decimation path configured to provide a second decimated signal based on the input signal, wherein the second decimation path has a faster response to a change in the input signal than the second decimation path, and an offset compensation circuit configured to estimate an offset of the input signal by applying chopping to the second decimation path and to compensate the estimated offset in the first decimation path.

EXAMPLE 13

The device of example 12, further comprising an analog-to-digital converter configured to provide the input signal, wherein the offset compensation circuit is configured to apply a chopping signal at an input of the analog-to-digital converter and at an output of the second decimation path.

EXAMPLE 14

The device of example 12 or 13, wherein the offset compensation circuit in configured to estimate a slew rate of an output signal of the second decimation path and to estimate the offset based on the slew rate.

EXAMPLE 15

A method, comprising: applying a first window function to a first digital signal to generate a second digital signal, applying a second window function to the first digital signal to generate a third digital signal, wherein a window length of the second window function is shorter than a window length of the first window function, integrating the second digital signal or a signal derived therefrom to generate a fourth digital signal, and integrating the third digital signal or a signal derived therefrom to generate a fifth digital signal.

EXAMPLE 16

The method of example 15, wherein the first window length is an integer multiple of the second window length.

EXAMPLE 17

The method of example 15 or 16, further comprising generating at least one of the first and second window function based on an interpolation between supporting points.

EXAMPLE 18

The method of any one of examples 15-17, wherein applying the first window function comprises: applying a first part of the second window function to generate first samples of the second digital signal, followed by scaling samples of the first digital signal by a maximum value of the second window function to generate second samples of the second digital signal following the first samples, followed by applying a second part of the second window function to generate third samples of the second digital signal following the second samples.

EXAMPLE 19

The method of any one of examples 15-18, further comprising: converting an analog signal to the first digital signal, applying a chopping signal to the analog signal and to the fifth digital signal, estimating an offset of the first digital signal based on the fifth digital signal and the applied chopping signal, and compensating the estimated offset in the fourth digital signal.

EXAMPLE 20

The method of example 19, further comprising: activating the chopping signal of said estimating step, and deactivating the chopping signal when using the offset compensated fourth digital signal.

However, the above is merely an example environment for further illustration, and embodiments discussed herein may be used in various applications where a signal having a sampling rate is to be decimated.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

It is therefore intended that the appended claims encompass any such modifications or embodiments.

What is claimed is:

1. A device, comprising:
   a windowing circuit configured to apply a first window function to a first digital signal to generate a second digital signal and to apply a second window function to the first digital signal to generate a third digital signal, wherein a window length of the first window function is longer than a window length of the second window function,
   a first integrator configured to receive the second digital signal,
   a second integrator configured to receive the third digital signal,
   an analog-to-digital converter configured to output the first digital signal based on a received analog signal,
   a chopping circuit configured to apply a chopping signal at an input of the analog-to-digital converter and at an output of the second integrator, and
   an offset compensation circuit configured to estimate an offset of the first digital signal based on an output signal of the second integrator and the applied chopping signal, and to compensate the estimated offset in an output signal of the first integrator.

2. The device of claim 1, wherein the window length of the first window function is an integer multiple of the window length of the second window function.

3. The device of claim 1, wherein a sampling rate of a fourth digital signal output by the first integrator and a fifth digital signal output by the second integrator is lower than a sampling rate of the first digital signal.

4. The device of claim 1, wherein at least one of the first window function and the second window function is selected from the group consisting of a Tuckey window, a Hamming window or a Hanning window.

5. The device of claim 1, wherein the windowing circuit comprises a window function generator configured to generate at least one of the first window function and the second window function based on an interpolation between stored coefficients.

6. The device of claim 1, wherein the windowing circuit comprises a window function generator configured to generate the second window function, wherein the windowing circuit is configured to apply the first window function by:
   applying a first part of the second window function to generate first samples of the second digital signal, followed by
   scaling samples of the first digital signal by a maximum value of the second window function to generate second samples of the second digital signal following the first samples, followed by
   applying a second part of the second window function to generate third samples of the second digital signal following the second samples.

7. The device of claim 6, wherein the windowing circuit further comprises a multiplier, wherein a first input of the multiplier is arranged to receive the first digital signal, wherein a second input of the multiplier is coupled to an output of the window function generator, and wherein an output of the multiplier is coupled to an input of the second integrator and to a first input of a multiplexer, wherein a second input of the multiplexer is arranged to receive the first digital signal, and wherein an output of the multiplexer is coupled to an input of the first integrator.

8. The device of claim 1, further comprising an evaluation circuit configured to control a further device based on an output of the first integrator and to detect a malfunction based on an output of the second integrator.

9. The device of claim 1, wherein the offset compensation circuit is configured to perform an averaging of the estimated offset.

10. The device of claim 1, wherein the offset compensation circuit is configured to estimate a slew rate of the output signal of the second integrator and to estimate the offset based on the estimated slew rate.

11. A device, comprising:
    a first decimation path configured to provide a first decimated signal based on an input signal,
    a second decimation path configured to provide a second decimated signal based on the input signal, wherein the second decimation path has a faster response to a change in the input signal than the first decimation path, and
    an offset compensation circuit configured to estimate an offset of the input signal by applying chopping to the second decimation path and to compensate the estimated offset in the first decimation path.

12. The device of claim 11, further comprising an analog-to-digital converter configured to provide the input signal, wherein the offset compensation circuit is configured to apply a chopping signal at an input of the analog-to-digital converter and at an output of the second decimation path.

13. The device of claim 12, wherein:
    the first decimation path comprises a first integrator;
    the second decimation path comprises a second integrator; and
    the offset compensation circuit is further configured to estimate the offset of the input signal based on an output signal of the second integrator and the applied chopping signal, and to compensate the estimated offset in an output signal of the first integrator.

14. The device of claim 11, wherein the offset compensation circuit is configured to estimate a slew rate of an output signal of the second decimation path and to estimate the offset based on the slew rate.

15. A method, comprising:
    converting an analog signal to a first digital signal,
    applying a first window function to the first digital signal to generate a second digital signal,
    applying a second window function to the first digital signal to generate a third digital signal, wherein a window length of the second window function is shorter than a window length of the first window function,
    integrating the second digital signal or a signal derived therefrom to generate a fourth digital signal,
    integrating the third digital signal or a signal derived therefrom to generate a fifth digital signal,
    applying a chopping signal to the analog signal and to the fifth digital signal,
    estimating an offset of the first digital signal based on the fifth digital signal and the applied chopping signal, and
    compensating the estimated offset in the fourth digital signal.

16. The method of claim 15, wherein the window length of the first window function is an integer multiple of the window length of the second window function.

17. The method of claim 15, further comprising generating at least one of the first window function and the second window function based on an interpolation between stored coefficients.

18. The method of claim 15, wherein applying the first window function comprises:

applying a first part of the second window function to generate first samples of the second digital signal, followed by scaling samples of the first digital signal by a maximum value of the second window function to generate second samples of the second digital signal following the first samples, followed by applying a second part of the second window function to generate third samples of the second digital signal following the second samples.

19. The method of claim 15, further comprising:

activating the chopping signal of said estimating step, and deactivating the chopping signal when using the offset compensated fourth digital signal.

* * * * *